(12) United States Patent
Nataraj

(10) Patent No.: US 7,215,004 B1
(45) Date of Patent: May 8, 2007

(54) INTEGRATED CIRCUIT DEVICE WITH ELECTRONICALLY ACCESSIBLE DEVICE IDENTIFIER

(75) Inventor: Bindiganavale S. Nataraj, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/883,161

(22) Filed: Jul. 1, 2004

(51) Int. Cl.
 *H01L 29/00* (2006.01)
(52) U.S. Cl. ........................... 257/536; 257/296
(58) Field of Classification Search ................ 257/208, 257/209, 210, 211, 536, 797, 261, 296
 See application file for complete search history.

(56) References Cited

U.S. PATENT DOCUMENTS

| | | | |
|---|---|---|---|
| 4,933,903 A * | 6/1990 | Nakaizumi | 365/189.11 |
| 5,225,702 A * | 7/1993 | Chatterjee | 257/360 |
| 5,294,812 A | 3/1994 | Hashimoto et al. | |
| 5,453,384 A * | 9/1995 | Chatterjee | 438/135 |
| 5,517,051 A * | 5/1996 | Chatterjee | 257/360 |
| 5,723,876 A * | 3/1998 | Ray | 257/48 |
| 6,114,882 A * | 9/2000 | Flynn | 327/103 |
| 6,446,017 B1 | 9/2002 | Skidmore | |
| 6,446,248 B1 * | 9/2002 | Solomon et al. | 716/17 |
| 6,477,079 B2 * | 11/2002 | Kaneko et al. | 365/149 |
| 6,622,102 B2 | 9/2003 | Skidmore | |
| 6,750,479 B2 | 6/2004 | Haag | |
| 2002/0085163 A1 | 7/2002 | Park et al. | |
| 2002/0152043 A1 | 10/2002 | Skidmore | |
| 2003/0227320 A1* | 12/2003 | Davis | 327/430 |
| 2004/0251470 A1 | 12/2004 | Catalasan et al. | |
| 2004/0251472 A1 | 12/2004 | Catalasan et al. | |
| 2004/0253778 A1 | 12/2004 | Catalasan et al. | |

FOREIGN PATENT DOCUMENTS

| | | |
|---|---|---|
| EP | 1341214 A1 | 9/2003 |
| JP | 01305495 A2 | 12/1989 |
| WO | WO 04021022 A2 | 3/2004 |
| WO | WO 04021022 A3 | 3/2004 |

* cited by examiner

*Primary Examiner*—Sheila V. Clark
(74) *Attorney, Agent, or Firm*—Shemwell Mahamedi LLP

(57) ABSTRACT

An semiconductor device having a plurality of fabrication layers. A first region of a first fabrication layer of the semiconductor device is revised. To signal the revision, a connectivity structure in a second region of the first fabrication layer is omitted to interrupt an otherwise continuous signal path that extends through a plurality of interconnection layers of the semiconductor device.

18 Claims, 7 Drawing Sheets

INTEGRATED CIRCUIT DEVICE WITH ELECTRONICALLY ACCESSIBLE DEVICE IDENTIFIER

FIELD OF THE INVENTION

The present invention relates generally to the field of integrated circuit technology, and more particularly to run-time determination of integrated circuit device characteristics.

BACKGROUND

Integrated circuit devices are usually marked with various identifying information, such as device type, production date, manufacturer and so forth. Such marking is often formed directly on the integrated circuit die, for example, by etching alphanumeric characters into the substrate or oxide layer. Unfortunately, once the die is encapsulated within an opaque package housing, the on-die marking is no longer visible. Consequently, unless the desired information is printed on the package housing, the package may need to be disassembled to access the on-die information. Even when the desired information is printed on the device housing, visual inspection is still typically required to recover the information and may be difficult or impractical due to the mounting orientation of the device (e.g., print-side down), inaccessibility of the device within a system, or inaccessibility of the system itself.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
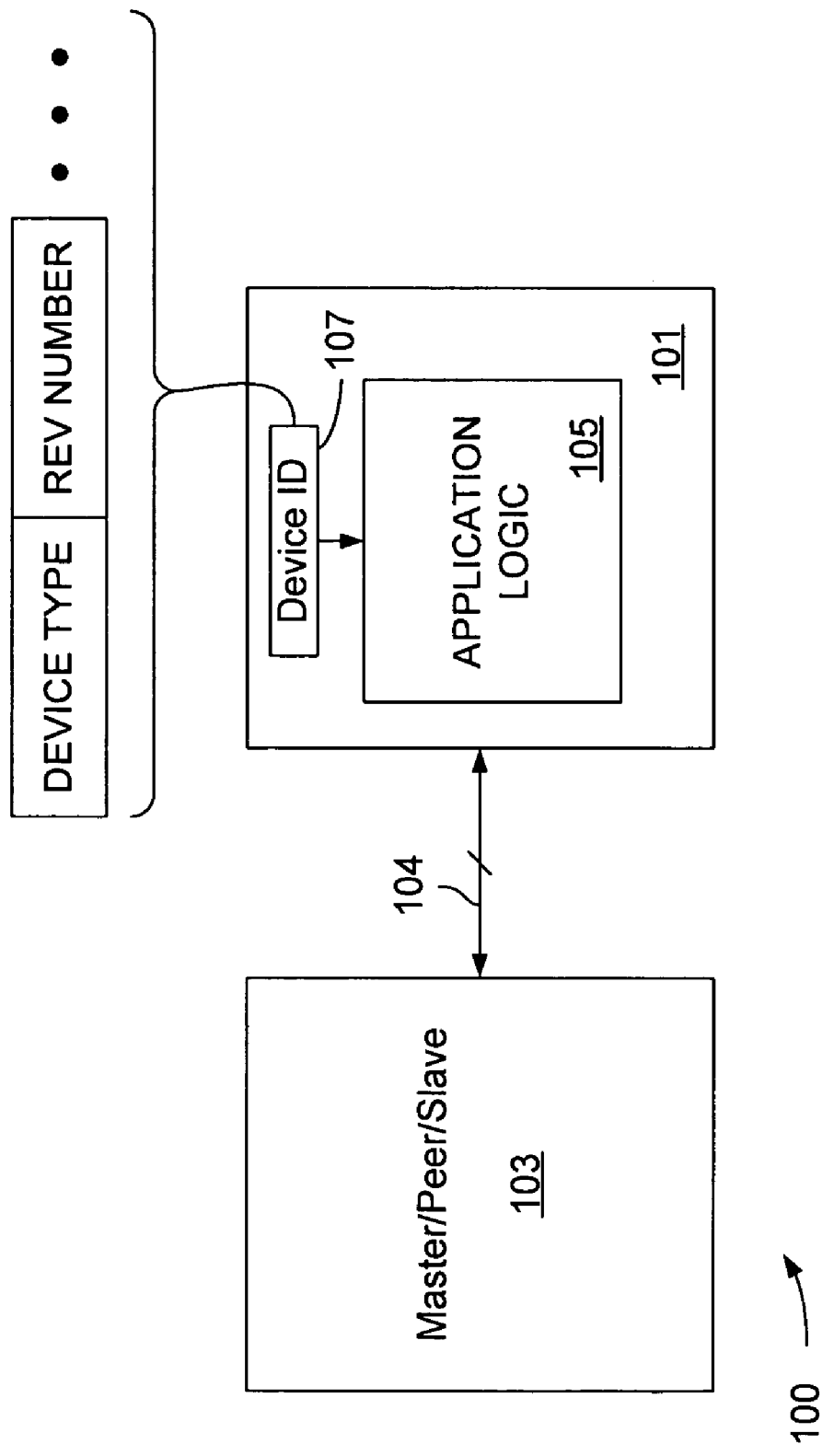
FIG. 1 illustrates an electronic system in which embodiments of the invention may be used.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express but an example, and not a preference or requirement.

In embodiments of the present invention, an electronically accessible device identification (ID) structure is formed on the integrated circuit device to permit an external device or remote system to read ID information from the integrated circuit device during device operation. The ID information may also be used by other circuitry formed on the integrated circuit device, for example, to determine one or more configuration settings, communication protocols or other operating characteristics.

In one embodiment, the device ID structure is formed by one-time programmable circuitry such as a non-volatile storage register or fused circuit that may be programmed with the desired identification information. In another embodiment, the device ID structure is hardwired during device fabrication to establish the desired device identification. In other embodiments, the device ID information is provided by a combination of programmable circuitry and hardwired circuitry.

In particular device ID structure embodiments described below, revision information (i.e., indicating the revision of a particular product design) and other device ID information is manifested in hardwired structures referred to herein as multi-layer revision cells. In one embodiment, each multi-layer revision cell includes a pull-up circuit (or pull-down circuit) and a continuity stack that extends in a continuous signal path through each mask-generated layer of the device to a reference voltage node (e.g., ground). When a given device layer is revised, a continuity element or other connectivity structure contributed to the continuity stack by the revised layer is removed, thereby interrupting the continuous signal path to the reference voltage node and signaling the revision. By this operation, a revision is signaled by a modification in the revised layer itself, avoiding the need to revise otherwise unchanged layers merely to signal the revision. These and other aspects and embodiments of the invention are described below.

Operational Context

FIG. 1 illustrates an electronic system 100 in which embodiments of the invention may be used. The system 100 includes integrated circuit devices 101 and 103 interconnected through one or more signal paths 104. The integrated circuit devices 101 and 103 may operate, respectively, as master and slave or vice-versa, or as peers, or may switch between master, slave and/or peer roles at different times. Also, the integrated circuit devices 101 and 103 may be implemented in separately packaged integrated circuit dice, in separate dice packaged together in a common package (e.g., multi-chip package, paper thin package, etc.), or in a single die as in the case of a system-on-chip or multi-functional application-specific integrated circuit (ASIC).

Integrated circuit device 101 includes application logic 105 and a device ID circuit 107. The application logic 105 may include any number of circuit blocks as necessary to carry out the core functions of the ID device 101. The device ID circuit may hold information of various types including, without limitation, device type and revision number as shown, as well as manufacturing information (e.g., date, location, lot number, process-type, name of manufacturer etc.), tolerance information, or any other information that may be used to identify or characterize the integrated circuit device 101. The integrated circuit device 103 may access the device ID circuit 107 directly, receiving device ID information via one or more of signal paths 104, or may issue one or more instructions to the application logic 105, requesting the application logic 105 to obtain information from the device ID circuit 107 and output the information via signal paths 104. In either case, the integrated circuit device 103 may use the device identification information for configuration control or other purposes, and may output the information to other devices or systems.

Figure 2:
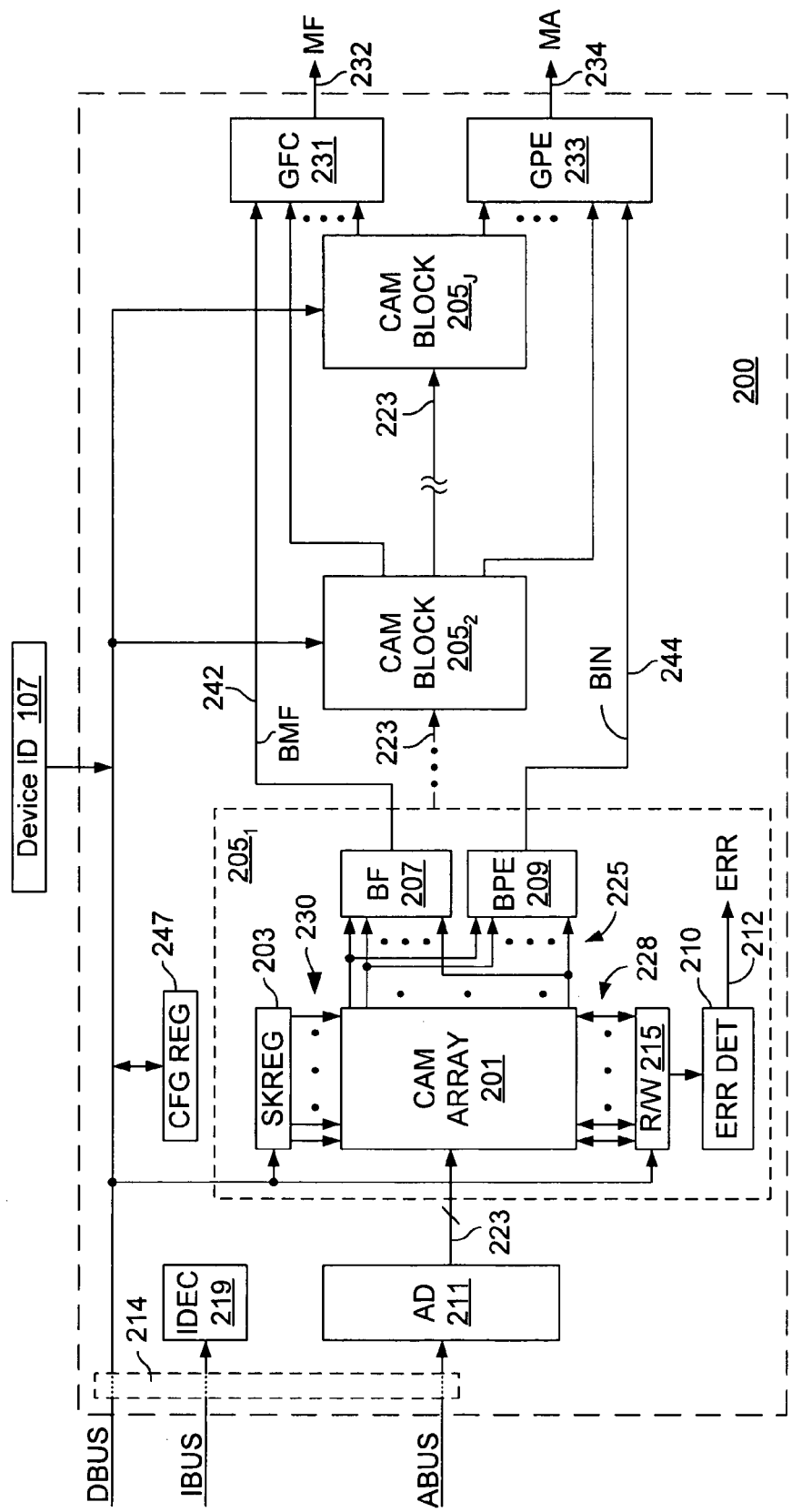
FIG. 2 illustrates an embodiment of the integrated circuit device of FIG. 1 in which the application logic includes a content addressable memory device.

FIG. 2 illustrates an embodiment of the integrated circuit device 101 of FIG. 1 in which the application logic 105 includes a content addressable memory (CAM) device 200. The CAM device 200 is used to compare search keys received via a data bus (DBUS) with contents of a database stored in one or more internal associative storage arrays, referred to herein as CAM arrays. If a search key matches an entry in the database, the CAM device 200 generates a match address (MA) that corresponds to the matching entry and asserts a match flag (MF) to signal the match condition. The match address is then typically used to address another storage array to retrieve associated information (e.g., packet forwarding information, classification information, policy information, etc.). The storage array addressed by the match address may be included within the integrated circuit device 101 along with the CAM device 200, or may be located in another integrated circuit device.

The CAM device 200 includes multiple independently selectable CAM blocks, $205_1$–$205_J$, instruction decoder 219 (IDEC), address logic 211 (AD), global flag circuit 231 (GFC) and global priority encoder 233 (GPE). A number of other circuit blocks, not shown, may also be included within the CAM device 200 including, without limitation, input/output drivers, status registers, configuration circuits, associated storage, and so forth.

As shown in the detail view of CAM block $205_1$, each of the CAM blocks 205 includes a CAM array 201, block flag circuit 207 (BF), block priority encoder 209 (BPE), search key register 203 (SKREG), read/write circuit 215, and error detection logic 210. The CAM array 201 constitutes an associated storage for storing database entries, referred to herein as CAM words, and includes CAM cells (not specifically shown) arranged in rows and columns. Precharged match lines 225 are coupled to respective rows of the CAM cells, and bit line pairs 228 and compare line pairs 230 are coupled to respective columns of the CAM cells. Collectively, the bit line pairs form a data port for read/write access to address-selected rows of CAM cells, and the compare line pairs form a compare port for inputting search values (also called search keys and comparands) to the CAM array 201 during search operations. The CAM cells themselves are specialized store-and-compare circuits each having a storage element to store a constituent bit of a CAM word presented on the bit lines and a compare circuit for comparing the stored bit with a corresponding bit of a search value presented on the compare lines. In one embodiment, the compare circuits within the CAM cells of a given row are coupled in parallel to the match line for the row, with each compare circuit switchably forming a discharge path to discharge the match line if the stored bit and search bit do not match (other CAM cells arrangements may be used in alternative embodiments). By this arrangement, if any one bit of a CAM word does not match the corresponding bit of the search value, the match line for the row is discharged to signal the mismatch condition. If all the bits of the CAM word match the corresponding bits of the search value, the match line remains in its precharged state to signal a match. Because a comparand value is presented to all the rows of CAM cells in each search operation, a rapid, parallel search for a matching CAM word is performed.

The CAM array 201 may be populated with different types of CAM cells in different embodiments including, without limitation, binary, ternary and quaternary CAM cells. In the case of a ternary or quaternary CAM cell, one or more additional storage circuits may be provided to store masking information or encoded mask and data information, and multiple pairs of bit lines may be provided per column of CAM cells. Alternatively, one or more pairs of bit lines may be multiplexed for read/write access to different storage elements within a selected CAM cell. Also, in alternative embodiments, either the bit lines or compare lines may be eliminated and the remaining lines used for both search and data access operations.

Instructions such as database read, write and search instructions are issued to the CAM device 200 by a host processor, network processor or other control device (not shown in FIG. 2) via an instruction bus (IBUS). In the case of read and write instructions, the control device may additionally issue address values to the CAM device 200 via address bus (ABUS) to specify storage locations to be accessed within one or more of the CAM blocks 205. The instruction decoder 219 responds to instructions received via the instruction bus 202 by signaling other circuit blocks within the CAM device 200 to perform the instructed operation. The address logic 211 receives addresses from the address bus 206 and may include internal registers for storing addresses generated within the CAM device 200 including, without limitation, a next free address (NFA) register to store an address of the highest priority, unoccupied location within a CAM block (or all the CAM blocks); a highest priority match (HPM) register to store a match address generated after a search operation within the CAM device 200; an error check register to store an address of a storage location within a given CAM array (or all the CAM arrays) to be error-checked (e.g., for parity error, cyclic redundancy check error, error correction code error, or other error); and any other useful addresses. During a read or write access to the CAM array 201 within a given CAM block 205, the address source is selected by the address logic 211 in response to a control signal from the instruction decoder 219 (or other control circuitry), and decoded by the address logic 211 to activate a word line 223 that corresponds to a selected row of CAM cells within the CAM array 201. The read/write circuit 215 then outputs a write data value onto the bit lines 228 for storage in the selected row or, in the case of a read operation, senses a read data value output onto the bit lines by the selected row. In one embodiment, a read or write operation is carried out by activating an address-selected word line 223 that extends across the CAM arrays 201 in all or a portion of the CAM blocks $205_1$–$205_J$. Alternatively, separate word lines 223 and/or address logic 211 may be provided for each CAM block 205. A block address sub-field of the address is used to enable the read/write circuit 215 within one of the CAM blocks $205_1$–$205_J$, thereby resolving the overall read or write operation to a particular row of CAM cells (or portion thereof) within a particular CAM block 205. During an error checking operation, the sense amplifiers within all the CAM blocks $205_1$–$205_J$ (i.e., within the read/write circuits 215) may be enabled concurrently to enable data values to be read from the same row location within each CAM array 201 in each CAM block 205, and checked for error in a respective error detection circuit 210. Because separate compare lines 230 and bit lines 228 are provided within each of the CAM arrays 201, such error checking operations may be executed without interrupting (or interfering with) the stream of search operations executed within the CAM device 200.

In one embodiment, the error detection circuit 210 includes a parity checking circuit that generates one or more parity bits based on the CAM word read from the CAM array 201, then compares the generated parity bits to parity bits included in or with the CAM word. The parity bits may be generated by the read/write circuit at the time a write data value is written into the CAM array 201 or may be generated externally and provided as part of the write data. In either case, if the generated parity bits do not match the stored parity bits, the error may be signaled by assertion of an error signal 212 (ERR) and/or by recording an error status in a status register (not shown in FIG. 200) of the CAM device 200. The address from which the CAM word in error was read may be stored in a register for later access by the host processor, network processor or other control device. Instead of a parity-checking operation, the error detection circuit 210 may perform a cyclic redundancy check, checksum check, syndrome check (e.g., a syndrome generated from an error correction code) or any other type of error checking operation.

In the embodiment of FIG. 2, the search key register 203 is used to store a search value received via the data bus and includes compare line drivers to drive the search value onto compare lines of the corresponding CAM array 201. Alternatively, the search key register 203 may be omitted and the search value may be supplied directly from the data bus to the CAM array 201. Search key registers 203 within the different CAM blocks 205 may be provided with the same or different search values and may be enabled to drive the search values onto the compare lines of the corresponding CAM arrays 201 simultaneously, or in pipelined fashion. Also, mapping circuitry may be provided to map incoming bits of a search value to encoded values. In other embodiments, one or more of the CAM blocks $205_1$–$205_J$ may have a filter circuit that is programmable to selectively provide, as the search value to be input to the corresponding CAM array 201, one or more bits or fields of a value received via the data bus.

During a search operation within a given CAM block 205, search results generated within the CAM array 201 are output via match lines 225 to the block flag circuit 207 and block priority encoder 209. The block flag circuit 207 outputs a block match flag signal 242 to indicate whether a match has been detected in the corresponding CAM array 201, and may additionally output a multiple match flag signal (not shown) to indicate whether multiple matches have been detected within the CAM array 201. The block priority encoder 209 outputs a block index 244 (i.e., an address value) that corresponds to the CAM array location containing the highest priority database entry determined to match the comparand value. The relative priorities of database entries may be programmable within individual CAM blocks and/or from CAM block to CAM block. Alternatively, CAM word priority may be fixed within CAM blocks (e.g., according to a predetermined priority policy such as an address-dependent priority policy) and/or from CAM block to CAM block.

The block match flags from each of the CAM blocks $205_1$–$205_J$ are input to a global flag circuit 231 which generates a device match flag signal 232 according to whether any matches were detected in the CAM device 200. As with the block flag circuit 207, the global flag circuit 231 may also output a device multiple match flag signal to indicate whether multiple matches were detected in the CAM device 200. The block indices 244 generated by the CAM blocks $205_1$–$205_J$ are input to a global priority encoder 233 which determines a highest priority one of the block indices 244 and outputs a corresponding match address 234. The match address 234 includes the highest priority one of the block indices 244 together with a block address segment that identifies the CAM block 205 that sourced the highest priority block index. In one embodiment, the block priority encoder 209 within each CAM block 205 outputs a predetermined "no-match" code when none of the match signals 225 is asserted. The global priority encoder 233, in turn, treats the no-match code is as having a lowest of all possible priorities, so that a match detected within any of the CAM blocks $205_1$–$205_J$ will result in selection of the corresponding block index over the no-match code. In an alternative embodiment, the block match flags 242 are provided to the global priority encoder 233 along with the block indices 244. If a block match flag 242 is deasserted (i.e., to indicate that no match was detected within the corresponding CAM block 205), then the block index 244 from the same CAM block 205 is eliminated as a source of the block index portion of the match address 234.

In one embodiment, each match address 234 (or each match address for which the corresponding device match flag 232 is asserted) is supplied to the address logic 211 and used to read the corresponding CAM word from the indicated storage location (i.e., from a specified row of the CAM array 201 within a specified one of CAM blocks $205_1$–$205_J$) for error checking purposes. If an error is detected by the error detection circuit 210, then a qualifying error signal 212 is output from the CAM device along with the match address 234, to inform the host processor, network processor or other control device that the match address resulted from a match with a corrupted map word. Although output latency is increased by such error checking, the error checking operation may be executed concurrently with a subsequent search operation, so that search and error checking operations are effectively pipelined to maintain the search throughput of the CAM device.

In an alternative embodiment, a single CAM block 205 may be provided instead of the multiple CAM blocks $205_1$–$205_J$ depicted of FIG. 2. In such an embodiment, the global flag circuit 231 and global priority encoder 233 may be omitted, and the block flag circuit 207 and block priority encoder 209 used to source the match flag and match address, respectively. Also, in one embodiment, the data bus 204 is used to transmit write and read data to and from the CAM device 200 (i.e., in addition to delivering search values) and is therefore coupled to the read/write circuit 215 within each CAM block. In alternative embodiments, one or more of the address, instruction and data buses may be eliminated and the corresponding signals time multiplexed onto the remaining bus or buses. Also, each of the CAM blocks $205_1$–$205_J$ may be programmed to store and generate comparison results for one, two or more CAM words per row of CAM cells, in effect, enabling a programmable storage width and depth within the CAM block 205.

Still referring to FIG. 2, the device ID circuit 107 may be used to store device type and revision information as discussed above, and may also be used to store information specific to the CAM device 200 including, without limitation, timing information for timing operations within the CAM blocks 205 or other circuitry (e.g., controlling the timing of match latching signals according to performance measurements obtained during device production), error-control information for controlling error detection operations carried out by the error detector 210, priority policy information that may be used to select between different priority policies within the block priority encoders 209 and/or global priority encoder 233, shut-off information to selectively disable run-time operation of selected circuit blocks (e.g., for power savings purposes), instruction-set selection information for selecting between different instruction sets, so forth. Thus, while the device ID circuit 107 is depicted as being coupled to the data bus, the device ID circuit may additionally be coupled to any number of other circuit blocks within the CAM device 200 as necessary to provide information thereto. In one embodiment, a run-time programmable configuration register 247 is also provided within the CAM device 200 and may be used to complement the information provided by the device ID circuit 107. That is, the device ID circuit 107 may be used to provide one-time programmed or hardwired information to the CAM device and/or external circuitry, while the configuration register 247 may be programmed with run-time selectable information (e.g., logical width-depth configuration of individual CAM arrays 201, block select codes to enable logical grouping of various CAM blocks 205 during search operations and so forth) which may, in some cases, be redundant with information provided by the device ID circuit 107.

Device ID Circuit

Figure 3:
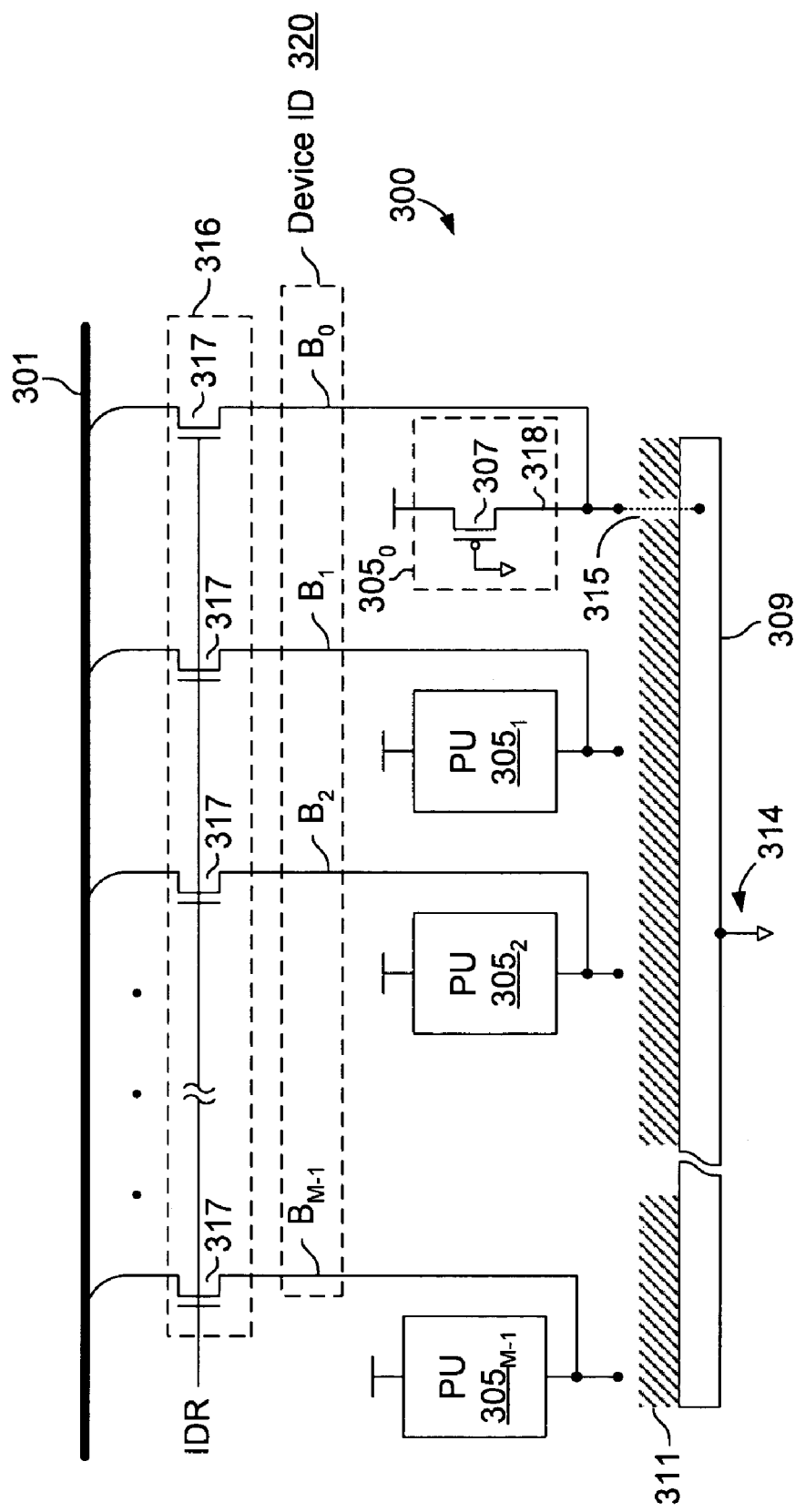
FIG. 3 illustrates a device identification circuit according to one embodiment.

FIG. 3 illustrates a device ID circuit 300 according to one embodiment. The device ID circuit 300 includes a plurality of pull-up circuits $305_0$–$305_{M-1}$ each coupled to a supply voltage, $V_S$, and, optionally, to a ground node 314. In the particular embodiment shown, each pull-up circuit 305 is formed by a P-type MOS (P-MOS) transistor 307 which is biased to act as a resistive element. That is, when the drain terminal 318 of the transistor 307 is coupled to ground, the resulting current flow through the transistor produces a voltage drop a voltage, $V_S$, and the drain terminal of the transistor, which constitutes the output node 318 of the pull-up circuit 305, is driven to a logic low state. By contrast, when the drain terminal of the transistor 307 is decoupled from ground, the output node 318 is pulled up substantially to $V_S$ to generate a logic high output. In the embodiment of FIG. 3, the ground node 314 connection is provided at a first interconnection layer 309 (referred to herein as a metal layer, though virtually any suitable conductive material may alternatively be used), disposed over the semiconductor substrate, with the pull-up circuits being formed by diffusion elements within the substrate. A dielectric layer 311 (e.g., an oxide such as silicon dioxide or other insulating material) is disposed between the metal layer 309 and the substrate. For each bit of the device ID 320 that is to be pulled low, a via 315 is formed in the dielectric layer 311 to establish electrical connection between the output node 318 of the pull-up circuit 305 and the metal layer 309. Thus, vias 315 may be selectively formed in the dielectric layer 311 to enable selective grounding of the output nodes 318 of pull-up circuits $305_0$–$305_{M-1}$, thereby forming an M-bit device ID value 320 that indicates the device type, revision number and/or other identification or characterizing information. In alternative embodiments, other types of resistive elements may be used in place of the P-MOS transistor 307, and pull-up rather than pull-down circuits may be used (e.g., selectively coupling drain terminals of N-type MOS transistors to a supply voltage). Moreover, the ground node connection may be established in any fabrication layer of the device, and other techniques for forming ground connections may be used.

Assuming that revision information is maintained in the device ID circuit 300, a change to a given fabrication layer of the integrated circuit device (e.g., a higher-level metal or dielectric layer, not shown) may necessitate a change in via layer 311 to signal revision in the device ID, even if the via layer 311 is otherwise unchanged. Because the change in any fabrication layer of an integrated circuit device usually requires generation and verification of a new mask (or reticle) for that layer, the need to change via layer 311 merely to change the revision number in the device ID may significantly increase the total cost of the revision.

Multi-Layer Revision Cell

Figure 4:
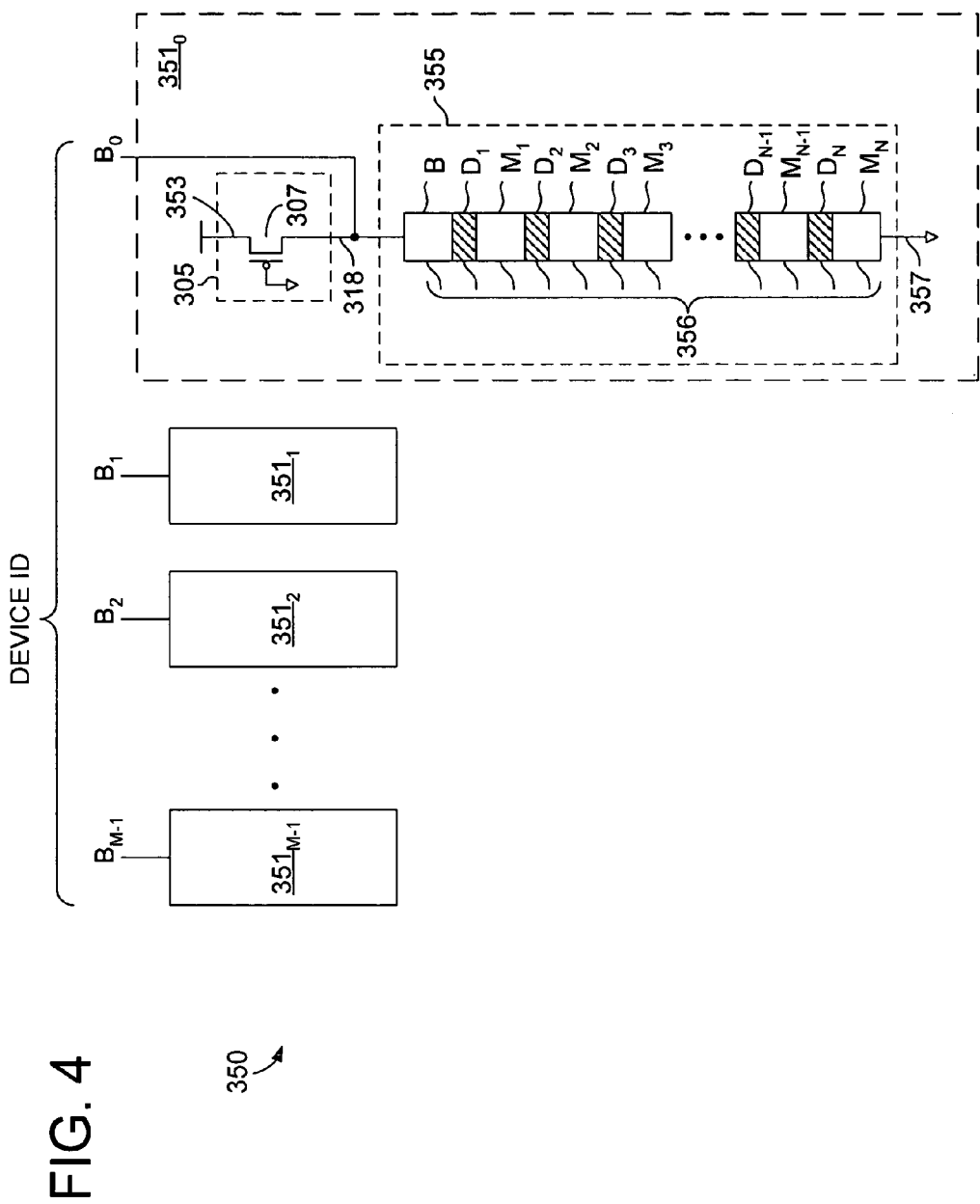
FIG. 4 illustrates a device identification circuit according to an alternate embodiment.

FIG. 4 illustrates an alternative embodiment of a device ID circuit 350 that may be formed within an integrated circuit device and used instead of or in combination with the device ID circuit 300 of FIG. 3. The device ID circuit 350 includes a number of multi-layer revision (MLR) cells $351_0$–$351_{M-1}$, each having a pull-up circuit 305 coupled to a supply voltage node, and a continuity stack 355 coupled between an output node 318 of the pull-up circuit and a ground node 357. The continuity stack 355 is formed by a series connection of continuity elements 356 each disposed in a respective mask-generated layer of the integrated circuit device 350 and therefore forms a continuous signal path that extends through each device fabrication layer. More specifically, in a fabrication process that yields a base layer (e.g., substrate, one or more diffusions, and poly gates), followed by alternating dielectric and metal layers, the continuity stack includes a base layer continuity element, B, disposed in contact with a continuity element formed in a first dielectric layer, $D_1$ (e.g., a via filled with metal or other conductive material), followed by a continuity element formed in a first metal layer, $M_1$, and so forth through dielectric and metal layers $D_2$, $M_2$ through $D_N$, $M_N$. In the embodiment of FIG. 4, the pull-up circuit 305 is formed by a P-MOS transistor 307 biased to operate as a resistive element. By this arrangement, when a continuity stack 355 is continuous (i.e., forms a continuous signal path between nodes 318 and 357), the drain terminal of the transistor 307

(which forms an output node 318 of the pull-up circuit and an output node of the MLR cell 351) is coupled to ground to generate a logic low MLR cell output. When one or more of the continuity elements 356 are omitted from the continuity stack, the path to ground is interrupted, and the MLR cell output is pulled high by the pull-up circuit 305. By this arrangement, when the mask used to form a given fabrication layer is revised, the continuity element 356 formed in that layer may be removed to interrupt the otherwise continuous signal path between the output node 318 and ground node 357, thereby signaling a design revision. Because the revision is indicated by a modification in the revised fabrication layer itself, otherwise unchanged fabrication layers need not be changed to signal the design revision. Thus, using the MLR cells $351_0$–$351_{M-1}$ to record revision information and other layer-specific identification information may reduce the number of masks that must be regenerated and verified to effect a design revision in the integrated circuit device.

In alternative embodiments, different types of resistive elements may be used to implement the pull-up circuit 305, and pull-down rather than pull-up circuits may be used. For example, in one alternative embodiment, a resistive element is coupled between a ground node and the output node 318 of each MLR cell 351, and the continuity stack 355 is coupled between a supply voltage and the output node 318 of the MLR cell 351, thus producing a high MLR cell output when the continuity stack 355 is continuous and a low MLR cell output when the continuity stack 355 is discontinuous. In other embodiments, the continuity stack 355 may include a plurality of selective-contact parallel connections between the MLR cell output node 318 and a reference voltage node (e.g., supply voltage node or ground node). Also, instead of a single continuity element for the base layer, which may be generated using several different masks, multiple continuity elements that correspond to different base layer masks may be included in the continuity stack 355. Also, while not specifically shown in FIG. 3, each MLR cell 351 may include a buffer circuit (e.g., one or more inverters) coupled between the output node 318 and the MLR cell output.

Figure 5:
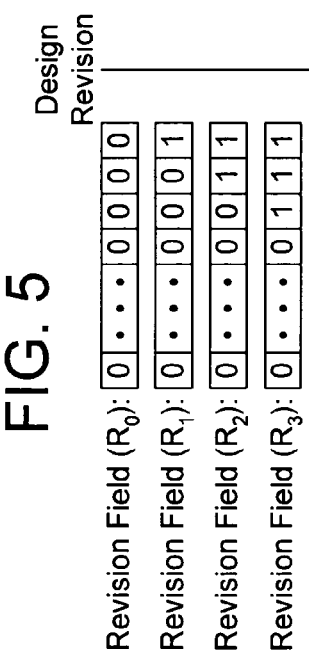
FIG. 5 illustrates the manner in which the multi-layer revision cells of FIG. 4 may be used to specify the revision number of a given integrated circuit device.

FIG. 5 illustrates the manner in which the MRL cells $351_0$–$351_{M-1}$ of FIG. 4 may be used to specify the revision number of a given integrated circuit device. The revision number may indicate the number of different mask sets generated for the integrated circuit device (i.e., each mask set being different from another mask set if at least one constituent mask has been revised) or, alternatively, the number of different designs of the integrated circuit device that have been released for production. As discussed above, the MRL cells $351_0$–$351_{M-1}$ may additionally be used to provide other device identification information and may be used in combination with other device ID circuits such as the device ID circuit 300 of FIG. 3.

Referring to FIGS. 4 and 5, in the first, un-revised production of a given integrated circuit device, $R_0$ (Revision 0), the continuity stacks within each of MLR cells $351_0$–$351_{M-1}$ include continuity elements from each device fabrication layer and therefore form continuous signal paths between the pull-up circuit 305 (or pull-down circuit) and the MLR cell output. Thus, the MLR cells $351_0$–$351_{M-1}$ each contribute a logic '0' bit to an M-bit revision field. In a first design revision of the integrated circuit device, $R_1$, one or more continuity elements 356 are removed from the continuity stack of MLR cell $351_0$, thereby flipping the state of the revision field bit contributed by MLR cell $351_0$ from '0' to '1'. For each device revision thereafter, the continuity stack of a different MLR cell 351 is rendered discontinuous (i.e., interrupted by removal of one or more continuity elements) to flip the state of the MLR cell output so that the revision field includes a progressively higher number of logic '1' bits. That is, the revision number is indicated by the number of logic '1' bits; a value referred to herein as decoded revision field. Ultimately, if the integrated circuit device is revised enough times (i.e., M−1 revisions), all the revision field bits are flipped to logic '1' states, rendering the device ID circuit 350 in a fully-consumed condition. By providing a conservative number of MLR cells 351 in proportion to the anticipated number of device revisions, the fully-consumed condition may be avoided.

Figure 6:
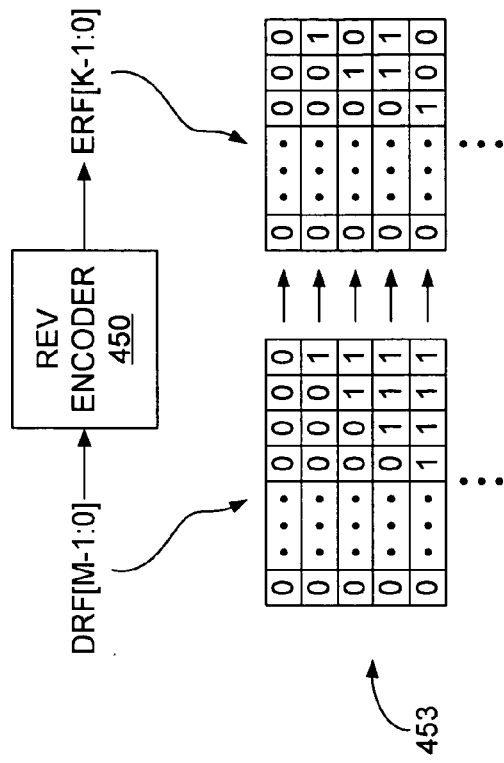
FIG. 6 illustrates a revision encoder circuit that may be used to convert the decoded revision field of FIG. 5 into an encoded revision field.

FIG. 6 illustrates a revision encoder circuit 450 that may be used to convert the decoded revision field of FIG. 5 into an encoded revision field. That is, the revision field DRF [M-1:0] is encoded as shown at 453 to create an encoded revision field, ERF[K-1:0] where, for example, $K=_2M$. As a specific example, a sixteen-bit decoded revision field may be encoded into a four-bit binary-encoded revision field in accordance with the following table:

TABLE 1

| DRF | ERF |
|---|---|
| 0000000000000000 | 0000 |
| 0000000000000001 | 0001 |
| 0000000000000011 | 0010 |
| 0000000000000111 | 0011 |
| . | . |
| . | . |
| . | . |
| 1111111111111111 | 1111 |

Other encoding schemes may be used in alternative embodiments.

Figure 7:
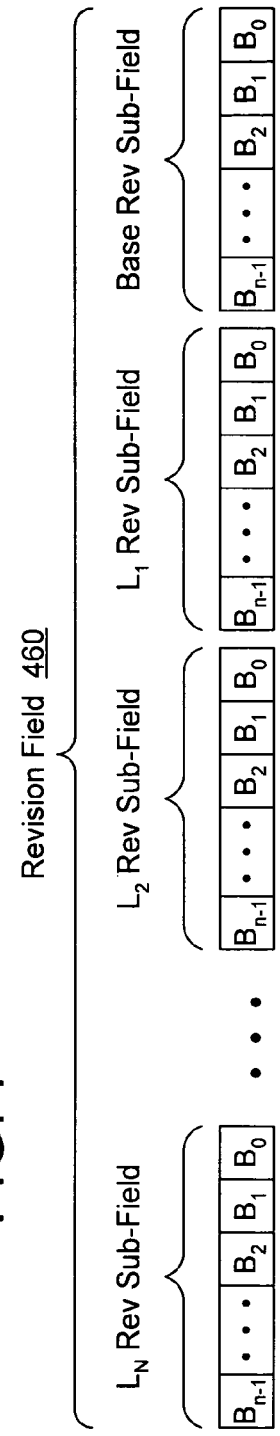
FIG. 7 illustrates a revision field according to an alternative embodiment.

FIG. 7 illustrates a revision field 460 according to an alternative embodiment. Instead of allocating one MLR cell per overall design revision, multiple MLR cells are allocated to each different fabrication layer, thereby providing an overall revision field having sub-fields that indicate the number of revisions to each fabrication layer. In the particular embodiment shown in FIG. 7, an equal number of MLR cells are allocated to each fabrication layer (e.g., n-bits to a base layer, n-bits to layer 0, n-bits to layer 1, and so forth). In an alternative embodiment, different numbers of MLR cells may be allocated to different fabrication layers in accordance with the number of anticipated revisions in that layer. Also, the base layer may be logically partitioned into different fabrication layers (e.g., according to the number of different masks applied) each having its own revision code. Also, the continuity stack within each MLR cell need only extend to the fabrication layer to which the MLR cell is allocated. For example, the continuity stacks within the MLR cells allocated to the revision sub-field for the metal-1 layer need only extend to the metal-1 layer and coupled at that point to an appropriate voltage node (e.g., ground or supply voltage). Alternatively, each of the continuity stacks may extend through all the fabrication layers, regardless of sub-field allocation.

Figure 8:
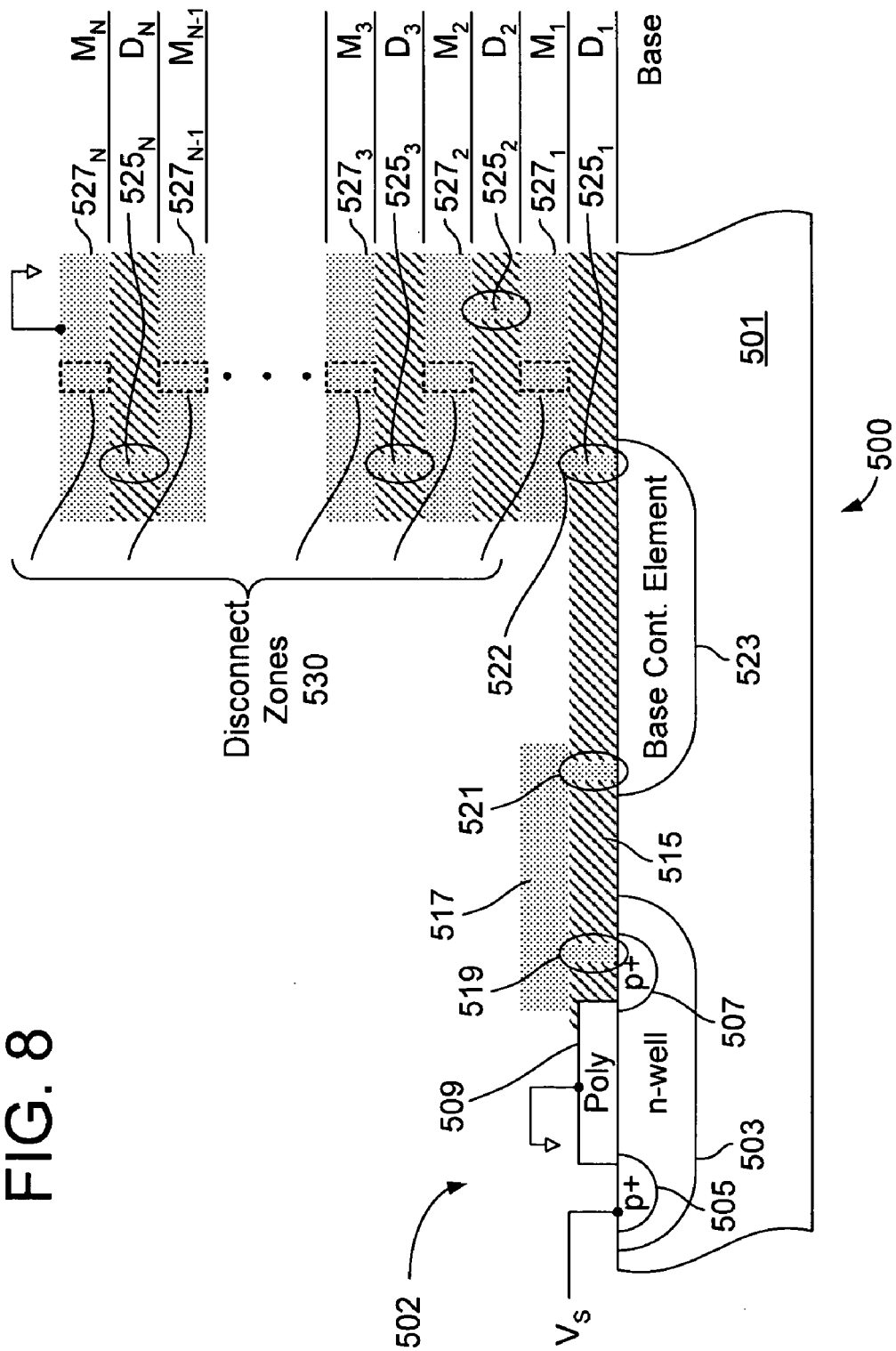
FIG. 8 illustrates an embodiment of a multi-layer revision cell.

FIG. 8 illustrates an embodiment of a MLR cell 500 formed on a silicon substrate 501 and that corresponds to the MLR cell $351_0$ of FIG. 4. More specifically, the MLR cell 500 includes a P-MOS transistor 502 having a channel disposed in n-well 503, and source and drain terminals 505 and 507, respectively, formed by diffusion of P-type dopant into the n-well 503. A poly gate 509 is formed over the channel and coupled to a bias voltage (ground, in this example) to establish the desired source-to-drain resistance through the P-MOS transistor 502. The source terminal 505 of the transistor 502 is coupled to a supply voltage node, $V_S$, via one or more connectivity structures (not specifically shown) and the drain terminal 507 is coupled to a bridge region 517 of metal layer $M_1$ by way of a via 519 (i.e., an opening) formed in dielectric layer $D_1$. Though not specifically shown, contact material may be formed at the surface of the diffusions that constitute source and drain terminals 505 and 507 to facilitate electrical contact therewith. Also, as discussed above, conductive materials other than metal may be used to form interconnection layers.

In the embodiment of FIG. 8, a low-resistivity dopant (e.g., an n+ dopant) is diffused into the substrate 501 to form a base-layer continuity element 523. The bridge region 517 of $M_1$ is coupled to a first terminal of the base continuity element 523 through via 521, thereby coupling the continuity element 523 to the drain terminal 507 of transistor 502. A second terminal of the base continuity element 523 is coupled to a $M_1$-layer continuity element 527, by way of a via 522 formed in dielectric layer, $D_1$. The via 522 itself, when filled with conductive material (e.g., filled with metal when the $M_1$ layer is formed), establishes a continuity element $525_1$ in dielectric layer $D_1$, the via and conductive fill material being referred to collectively herein as a conductive via. Thus, the continuity element $525_1$ in the $D_1$ layer is coupled to $M_1$ layer continuity element 527, which is coupled, in turn, through a continuity element $525_2$ (i.e., a conductive via) in dielectric layer $D_2$ to a continuity element $527_2$ in metal layer $M_2$. Thus, a stack of continuity elements is formed over the base layer 523 continuity element, extending through each fabrication layer of the integrated circuit device to a final continuity element $527_N$ in metal layer, $M_N$. Continuity element $527_N$ is coupled to a ground node, thus completing the interconnection between the drain terminal 507 of transistor 502 and ground. In the embodiment of FIG. 8, the drain terminal 507 of transistor 502 constitutes the MLR cell output and may be coupled to other circuitry (e.g., buffer circuit and/or one or more pass gates to enable access to the MLR cell output) via bridge region 517.

Still referring to FIG. 8, when the mask or reticle used to generate a metal layer or dielectric layer is altered, the corresponding continuity element for that layer may be omitted or otherwise altered to interrupt the path between the MLR cell output (i.e., at bridge region 517) and ground, thereby signaling the revision. More specifically, in the case of a dielectric layer revision, the via used to form the continuity element for that layer (i.e., $525_1$, $525_2$, $525_3$, ..., $525_N$) may be omitted, thereby decoupling (electrically isolating from one another) the continuity elements in the layers above and below the dielectric layer to interrupt the path to ground. In the case of a metal layer, metal (or other conductive material) may be omitted from a disconnect zone 530 in the corresponding continuity element (i.e., $527_1$, $527_2$, $527_3$, ..., $527_N$) as shown in FIG. 8. In one embodiment, each of the disconnect zones 530 is disposed within a metal layer continuity element 527 between two dielectric layer continuity elements 525 so that, when conductive material is omitted from the disconnect zone, the conductive path between the two dielectric layer continuity elements 525 is interrupted, thereby rendering the complete continuity stack discontinuous. In the case of a revision to one or more of the base layer masks (i.e., the masks used to generate the various diffusion regions 503, 505, 507, 523 and poly gate 509), the mask or masks may also be revised to omit the continuity element 523, thereby interrupting the path to ground and signaling the revision. In alternative embodiments, multiple base-layer continuity elements may be provided (e.g., one for each base layer mask) instead of the single continuity element 523.

Still referring to FIG. 8, in alternative embodiments, the disconnect zones 530 disposed within the metal layer continuity elements 527 may be disposed directly above and/or beneath continuity elements 525 in the surrounding dielectric layers. Also, as discussed above in reference to FIG. 3, a pull-down circuit may be used in place of the pull-up effected by transistor 502 and the top-of-stack continuity element (i.e., continuity element $527_N$ in the embodiment of FIG. 8) coupled to a logic high voltage instead of ground. Also, the continuity stack for one or more MLR cells may extend only to intermediate layers of the integrated circuit device, as discussed in reference to FIG. 7. Further, while the MLR cell 500 has been described in reference to a silicon substrate and corresponding fabrication process, other substrate types (e.g., gallium arsenide, germanium, silicon germanium, etc.) and fabrication processes may be used in alternative embodiments.

Figure 9:
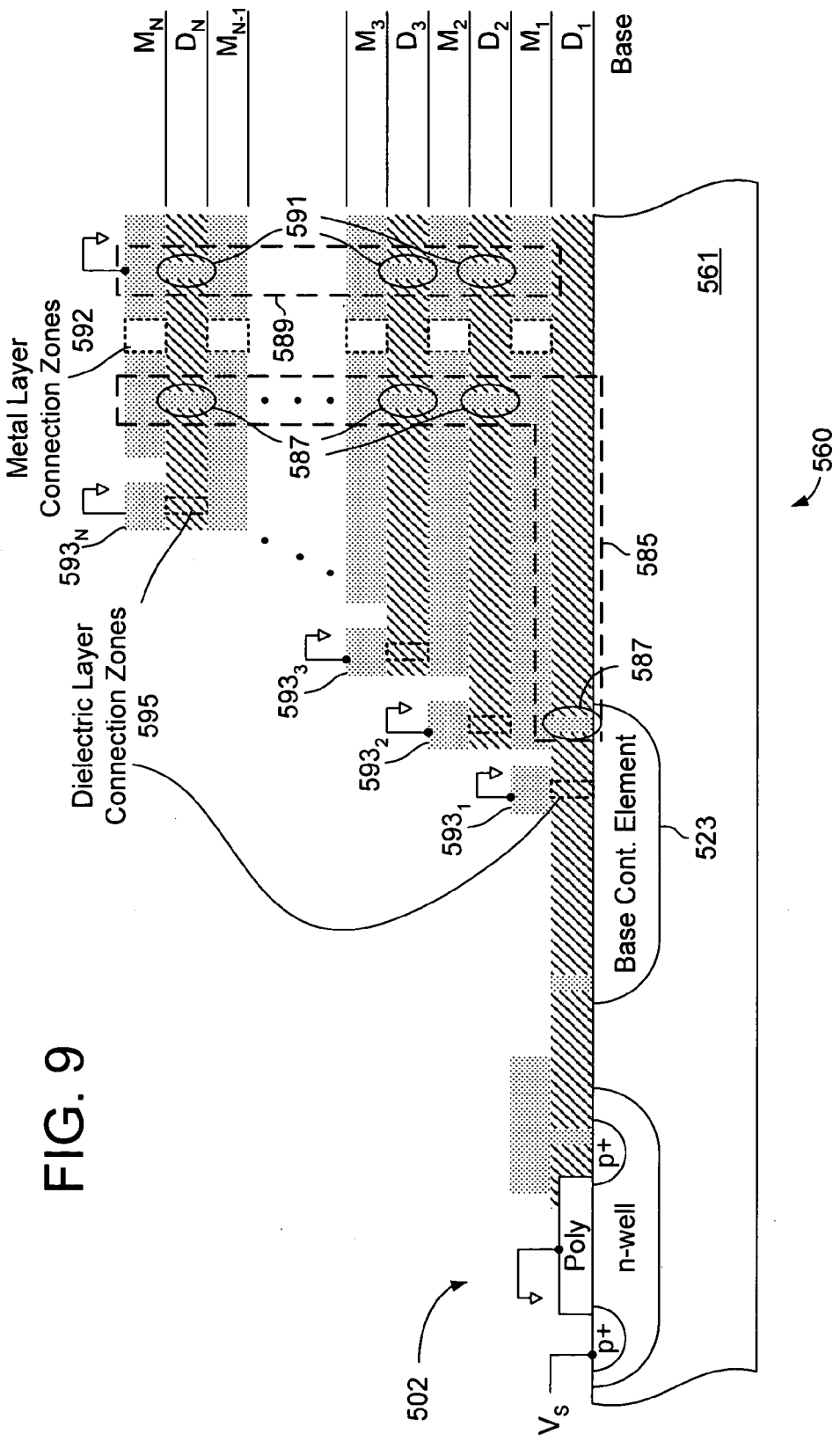
FIG. 9 illustrates an alternative embodiment of a multi-layer revision cell.

FIG. 9 illustrates an alternate embodiment of a MLR cell 560 formed on a silicon substrate 561. In contrast to the MLR cell 500 of FIG. 8, in which a continuous signal path between a pull-up circuit and ground is selectively interrupted, the MLR cell 560 includes a plurality of parallel paths between a pull-up circuit and ground which may be selectively formed to signal revision and other device identification information. In the particular embodiment shown, the MLR cell 560 includes the transistor 502, $M_1$-layer bridge region 517 and base continuity element 523, each connected to one another as described in reference to FIG. 8. The base continuity element 523 is additionally coupled to a first continuity stack 585 that extends through conductive vias 587 to each metal layer, $M_1$–$M_N$. In contrast to the continuity stack of FIG. 8, however, the final metal layer, $M_N$, in the continuity stack 585 is not coupled to a reference voltage node. Rather the entire continuity stack 585 is, when in an unrevised form, pulled to a logic high state by the operation of the transistor 502. A second, partial continuity stack 589, extends from the $M_1$ layer through conductive vias 591 to each of the other metal layers and is coupled to ground (e.g., by virtue of a ground connection at the $M_N$ layer, or any other of the $M_1$–$M_N$ layers). The continuity stacks 585 and 589 are separated from one another in each metal layer by a region referred to herein as a metal layer connection zone 592. Thus, if a revision is made to a given metal layer, the revision may be signaled by forming a continuous metal region that bridges the metal layer connection zone 592 for the revised layer, thus joining the continuity stacks 585 and 589 and providing a path to ground to pull-down the MLR cell output.

Still referring to FIG. 9, additional, ground-coupled metal regions $593_1$, $593_2$, $593_3$, $593_N$ are formed in metal layers $M_1$–$M_N$. As shown, dielectric layer connection zones 595 are located in each dielectric layer beneath a respective one of the regions $593_1$–$593_N$ and over a portion of the lower-level metal layer (or over base layer continuity element 523) that forms the continuity stack 585. By this arrangement, if a given dielectric layer is revised, a conductive via may be formed in the corresponding connection zone 595 to ground the continuity stack 585, thereby flipping the output state of the MLR cell and signaling the revision. Though not visible in the profile view of FIG. 9, an additional conductive via is disposed in dielectric layer $D_1$ adjacent a connection zone for the base continuity element 523 and coupled to region $593_1$. If the base layer is revised, the footprint of the base continuity element 523 may be extended to contact the conductive via, thereby pulling down the MLR cell output to signal the base layer revision. In alternative embodiments, multiple base-layer continuity elements may be provided (e.g., one for each base layer mask) instead of the single continuity element 523.

As in the embodiment of FIG. 8, a pull-down circuit may be used in place of the pull-up effected by transistor 502, and the continuity stack 585 and metal regions $593_1$–$593_N$ coupled to a logic high voltage (e.g., a supply voltage) instead of ground. Also, the continuity stacks 585 and 589 for one or more MLR cells may extend only to intermediate layers of the integrated circuit device, as discussed in reference to FIG. 7. Further, while the MLR cell 560 has been described in reference to a silicon substrate and corresponding fabrication process, other substrate types (e.g., gallium arsenide, germanium, silicon germanium, etc.) and fabrication processes may be used in alternative embodiments.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. An integrated circuit device comprising:
   a semiconductor substrate;
   a resistive element disposed in the semiconductor substrate and having a first end coupled to a first voltage node;
   a plurality of conductive layers disposed one above another over the semiconductor substrate, the conductive layers including a bottom conductive layer coupled to a second end of the resistive element and a top conductive layer coupled to a second voltage node; and
   a plurality of dielectric layers each disposed between a respective pair of the conductive layers and optionally having a via formed therein to establish a conductive path between the pair of conductive layers.

2. The integrated circuit device of claim 1 further comprising an output driver having an output to drive an external signal line and an input switchably coupled to the second end of the resistive element.

3. The integrated circuit device of claim 2 further comprising a transistor switch coupled between the input of the output driver and the second end of the resistive element.

4. The integrated circuit device of claim 3 further comprising a buffer circuit coupled between the second end of the resistive element and the transistor switch.

5. The integrated circuit device of claim 1 wherein the first voltage node is a supply voltage node and the second voltage node is a ground voltage node.

6. The integrated circuit device of claim 1 wherein the resistive element comprises a transistor having a first terminal coupled to the first voltage node and a second terminal coupled to the bottom conductive layer.

7. The integrated circuit device of claim 6 wherein the transistor is a metal-oxide semiconductor transistor having a gate terminal coupled to a ground voltage node.

8. The integrated circuit device of claim 1 further comprising a conductive region formed in the semiconductor substrate and coupled between the second end of the resistive element and the bottom conductive layer.

9. The integrated circuit device of claim 8 wherein the conductive region is a diffusion region formed in the semiconductor substrate.

10. The integrated circuit device of claim 8 wherein the conductive region includes first and second sub-regions capable of being electrically isolated from one another to decouple the second end of the resistive element from the second voltage node.

11. The integrated circuit device of claim 10 wherein the first and second sub-regions are electrically isolated from one another to indicate that another structure formed in the substrate have been revised.

12. The integrated circuit device of claim 1 further comprising a bottom dielectric layer disposed between the bottom conductive layer and the substrate, the bottom dielectric layer having a via formed therein and filled with conductive material to establish a conductive path between the bottom conductive layer and the second end of the resistive element.

13. The integrated circuit device of claim 1 wherein each of the conductive layers comprises first and second conductive regions capable of being electrically isolated from one another to decouple the second end of the resistive element from the second voltage node.

14. The integrated circuit device of claim 11 wherein the first and second conductive regions within at least one of the conductive layers are electrically isolated from one another to indicate that another structure formed in the at least one of the conductive layers has been revised.

15. The integrated circuit device of claim 1 wherein the via is omitted in at least one of the dielectric layers to indicate that another structure formed in the at least one of the dielectric layers has been revised.

16. A semiconductor device comprising:
    a semiconductor substrate;
    a plurality of connectivity layers disposed adjacent one another and adjacent the semiconductor substrate; and
    a plurality of revision cells that indicate a revision number of the semiconductor device, each of the revision cells including a respective region of the semiconductor substrate and respective regions of each of the connectivity layers; and
    wherein at least one of the regions included within one of the revision cells is discontinuous to interrupt a conductive path that extends through the semiconductor substrate and each of the connectivity layers.

17. A semiconductor device comprising:
    a semiconductor substrate;
    a plurality of connectivity layers disposed adjacent one another and adjacent the semiconductor substrate; and
    a plurality of revision cells that indicate a revision number of the semiconductor device, each of the revision cells including a respective region of the semiconductor substrate and respective regions of each of the connectivity layers; and
    wherein each of the revision cells comprises a respective resistive element formed in the semiconductor substrate and having a first end coupled to a first voltage node and a second end coupled to the respective region of the semiconductor substrate.

18. The semiconductor device of claim 17 wherein the plurality of connectivity layers include a top connectivity layer and wherein the respective region of the top connectivity layer included within each of the revision cells is coupled to a second voltage node.

* * * * *

UNITED STATES PATENT AND TRADEMARK OFFICE
CERTIFICATE OF CORRECTION

| | | |
|---|---|---|
| PATENT NO. | : 7,215,004 B1 | Page 1 of 1 |
| APPLICATION NO. | : 10/883161 | |
| DATED | : May 8, 2007 | |
| INVENTOR(S) | : Bindiganavale S. Nataraj | |

It is certified that error appears in the above-identified patent and that said Letters Patent is hereby corrected as shown below:

On the Title Page:

Change

"(57)      ABSTRACT
        An semiconductor device having a plurality of fabrication layers. A first region of a first fabrication layer of the semiconductor device is revised. To signal the revision, a connectivity structure in a second region of the first fabrication layer is omitted to interrupt an otherwise continuous signal path that extends through a plurality of interconnection layers of the semiconductor device."

to

--(57)      ABSTRACT
        A semiconductor device having a plurality of fabrication layers. A first region of a first fabrication layer of the semiconductor device is revised. To signal the revision, a connectivity structure in a second region of the first fabrication layer is omitted to interrupt an otherwise continuous signal path that extends through a plurality of interconnection layers of the semiconductor device.--.

In the Claims:

Claim 11, column 14, line 12, change "substrate have been revised."
                                     to --substrate has been revised.--.

Signed and Sealed this

Fourteenth Day of August, 2007

JON W. DUDAS
*Director of the United States Patent and Trademark Office*